(12) United States Patent
Inomata et al.

(10) Patent No.: US 11,525,082 B2
(45) Date of Patent: Dec. 13, 2022

(54) PHOSPHOR AND PRODUCTION METHOD THEREOF PHOSPHOR-INCLUDING MEMBER, AND LIGHT EMITTING DEVICE OR PROJECTOR

(71) Applicants: TAMURA CORPORATION, Tokyo (JP); KOHA CO., LTD., Tokyo (JP); National Institute for Materials Science, Ibaraki (JP)

(72) Inventors: Daisuke Inomata, Tokyo (JP); Yusuke Arai, Tokyo (JP); Kiyoshi Shimamura, Ibaraki (JP); Encarnacion Antonia Garcia Villora, Ibaraki (JP)

(73) Assignees: Tamura Corporation, Tokyo (JP); National Institute for Materials Science, Ibaraki (JP)

( * ) Notice: Subject to any disclaimer, the term of this patent is extended or adjusted under 35 U.S.C. 154(b) by 1082 days.

(21) Appl. No.: 16/074,163

(22) PCT Filed: Feb. 2, 2017

(86) PCT No.: PCT/JP2017/003793
§ 371 (c)(1),
(2) Date: Jul. 31, 2018

(87) PCT Pub. No.: WO2017/135373
PCT Pub. Date: Aug. 10, 2017

(65) Prior Publication Data
US 2021/0122975 A1 Apr. 29, 2021

(30) Foreign Application Priority Data
Feb. 2, 2016 (JP) .............................. JP2016-018448

(51) Int. Cl.
*C09K 11/77* (2006.01)
*C01F 17/34* (2020.01)
(Continued)

(52) U.S. Cl.
CPC .......... *C09K 11/7774* (2013.01); *C01F 17/34* (2020.01); *C09K 11/02* (2013.01);
(Continued)

(58) Field of Classification Search
CPC ..... C09K 11/7774; C30B 29/28; C30B 33/00; G03B 21/204; H01L 33/502; C01P 2001/61
See application file for complete search history.

(56) References Cited

U.S. PATENT DOCUMENTS 7,728,508 B2 6/2010 Kondo et al.
10,937,931 B2 * 3/2021 Jung ................... C09K 11/7715
(Continued)

FOREIGN PATENT DOCUMENTS

| | | |
|---|---|---|
| JP | H09-291279 A | 11/1997 |
| JP | 2005-353888 A | 12/2005 |

(Continued)

OTHER PUBLICATIONS

International Report on Patentability and Written Opinion dated Aug. 16, 2018 from related PCT/JP2017/003793.
(Continued)

*Primary Examiner* — C Melissa Koslow
(74) *Attorney, Agent, or Firm* — Scully, Scott, Murphy & Presser, PC

(57) ABSTRACT

Provided is a particulate phosphor including a single crystal having a composition represented by a compositional formula $(Y_{1-x-y-z}Lu_xGd_yCe_z)_{3+a}Al_{5-a}O_{12}$ ($0 \leq x \leq 0.9994$, $0 \leq y \leq 0.0669$, $0.001 \leq z \leq 0.004$, $-0.016 \leq a \leq 0.315$) and a particle diameter (D50) of not less than 20 μm. Also provided is a light-emitting device including a phosphor-including member that includes the phosphor and a sealing member including a transparent inorganic material sealing the phosphor or a binder including an inorganic material binding
(Continued)

particles of the phosphor, and a light-emitting element that emits a blue light for exciting the phosphor.

2 Claims, 12 Drawing Sheets

(51) Int. Cl.
    *C09K 11/02*     (2006.01)
    *C30B 29/28*     (2006.01)
    *C30B 29/60*     (2006.01)
    *C30B 33/00*     (2006.01)
    *G03B 21/20*     (2006.01)
    *H01L 33/50*     (2010.01)

(52) U.S. Cl.
    CPC .............. *C30B 29/28* (2013.01); *C30B 29/60* (2013.01); *C30B 33/00* (2013.01); *G03B 21/204* (2013.01); *H01L 33/502* (2013.01); *C01P 2002/52* (2013.01); *C01P 2004/03* (2013.01); *C01P 2004/61* (2013.01); *C01P 2006/37* (2013.01)

(56) References Cited

U.S. PATENT DOCUMENTS

| | | | |
|---|---|---|---|
| 10,975,497 B2 * | 4/2021 | Uwani | .................... C30B 29/28 |
| 2005/0276995 A1 | 12/2005 | Kondo et al. | |
| 2015/0083967 A1 * | 3/2015 | Watanabe | ............... C30B 15/04 |
| | | | 252/301.4 R |
| 2016/0043289 A1 | 2/2016 | Inomata et al. | |
| 2016/0240748 A1 | 8/2016 | Inomata et al. | |
| 2017/0179346 A1 | 6/2017 | Inomata et al. | |
| 2018/0044588 A1 | 2/2018 | Watanabe et al. | |
| 2018/0163127 A1 * | 6/2018 | Oshio | .................... C01F 17/34 |

FOREIGN PATENT DOCUMENTS

| | | | |
|---|---|---|---|
| JP | 5620562 B1 | | 11/2014 |
| JP | 5649202 B2 | | 1/2015 |
| WO | WO 2015/060254 A1 | | 4/2015 |
| WO | WO 2015/060350 A1 | | 4/2015 |
| WO | WO 2017/013867 | * | 1/2017 |
| WO | WO 2017/115778 | * | 7/2017 |

OTHER PUBLICATIONS

International Search Report dated Mar. 7, 2017 issued in PCT/JP2017/003793.
Latynina, Anastasiya et al., "Properties of Czochralski grown Ce, Gd:Y3Al5O12 single crystal for white light-emitting diode", Journal of Alloys and Compounds 553 (2013) pp. 89-92.
Villora, Encarnacion G et al., "Single-Crystal Phosphors for High-Brightness White LEDs and LDs", Journal of the Japanese Association for Crystal Growth (2015), vol. 42, No. 2, pp. 119-129.
Japanese Office Action dated Jul. 23, 2019 in Japanese Patent Application No. 2016-018448, with partial English translation.
Extended Supplementary European Search Report dated Aug. 26, 2019 in European Patent Application No. 17 74 7524.1.

* cited by examiner

PHOSPHOR AND PRODUCTION METHOD THEREOF PHOSPHOR-INCLUDING MEMBER, AND LIGHT EMITTING DEVICE OR PROJECTOR

TECHNICAL FIELD

The invention relates to a phosphor and a production method thereof, a phosphor-including member, and a light-emitting device or a projector.

BACKGROUND ART

A phosphor formed of YAG-based single crystal is known (see, e.g., JP 5,649,202 B). According to JP 5,649,202 B, the phosphor formed of the single crystal has excellent temperature characteristics in that a decrease in fluorescence intensity associated with temperature increase is less than ceramic powder phosphor.

Also, a light-emitting device is known which uses a particulate single crystal phosphor obtained by pulverizing a YAG-based single crystal ingot (see, e.g., JP 5,649,202 B and JP 5,620,562 B).

CITATION LIST

Patent Literatures

JP 5,649,202 B
JP 5,620,562 B

SUMMARY OF INVENTION

Technical Problem

It is an object of the invention to further improve the emission intensity and emission properties under high-temperature conditions of a particulate YAG-based or LuAG-based single crystal phosphor by optimizing a composition in the state of particles, and thereby to provide a particulate phosphor that includes a YAG-based or LuAG-based single crystal and that is excellent in emission intensity and, particularly, excellent in emission properties under high-temperature conditions, as well as a production method thereof, a phosphor-including member including the phosphor, and a light-emitting device or projector including the phosphor-including member.

Solution to Problem

To achieve the above-mentioned object, an embodiment of the invention provides a phosphor defined by [1], [2] below. Also, another embodiment of the invention provides a phosphor-including member defined by [3] below. Also, another embodiment of the invention provides a light-emitting device defined by [4], [5] below. Also, another embodiment of the invention provides a projector defined by [6], [7] below. Also, another embodiment of the invention provides a method for producing a phosphor defined by [8], [9] below.

[1] A particulate phosphor, comprising:
a single crystal having a composition represented by a compositional formula $(Y_{1-x-y-z}Lu_xGd_yCe_z)_{3+a}Al_{5-a}O_{12}$ ($0 \leq x \leq 0.9994$, $0 \leq y \leq 0.0669$, $0.001 \leq z \leq 0.004$, $-0.016 \leq a \leq 0.315$); and
a particle diameter (D50) of not less than 20 μm.

[2] The phosphor according to [1] above, wherein the particle diameter (D50) is not more than 120 μm.

[3] A phosphor-including member, comprising:
the phosphor according to [1] or [2] above; and
a sealing member comprising a transparent inorganic material sealing the phosphor or a binder comprising an inorganic material binding particles of the phosphor.

[4] A light-emitting device, comprising:
a phosphor-including member that comprises the phosphor according to [1] or [2] above and a sealing member comprising a transparent inorganic material sealing the phosphor or a binder comprising an inorganic material binding particles of the phosphor; and
a light-emitting element that emits a blue light for exciting the phosphor.

[5] The light-emitting device according to [4] above, wherein the light-emitting element comprises a laser diode.

[6] A projector, comprising:
a phosphor-including member that comprises the phosphor according to [1] or [2] above, and a sealing member comprising a transparent inorganic material sealing the phosphor or a binder comprising an inorganic material binding particles of the phosphor;
a light-emitting element that emits a blue light for exciting the phosphor;
an image-forming section that forms an image by using fluorescent light emitted from the phosphor-including member; and
a lens projecting the image formed by the image-forming section onto an external projection plane.

[7] The projector according to [6] above, wherein the light-emitting element comprises a laser diode.

[8] A method for producing a phosphor, comprising:
pulverizing a single crystal phosphor ingot having a composition represented by a compositional formula $(Y_{1-x-y-z}Lu_xGd_yCe_z)_{3+a}Al_{5-a}O_{12}$ ($0 \leq x \leq 0.9994$, $0 \leq y \leq 0.0669$, $0.001 \leq z \leq 0.004$, $-0.016 \leq a \leq 0.315$); and
forming a particulate phosphor that comprises a single crystal having said composition and a particle diameter (D50) of not less than 20 μm.

[9] The method for producing a phosphor according to [8] above, wherein the particle diameter (D50) is not more than 120 μm.

Advantageous Effects of Invention

According to an embodiment of the invention, a particulate phosphor can be provided that includes a YAG-based or LuAG-based single crystal and that is excellent in external quantum efficiency and excellent in emission properties under high-temperature conditions, as well as a production method thereof, a phosphor-including member including the phosphor, and a light-emitting device or projector including the phosphor-including member.

DESCRIPTION OF EMBODIMENTS

First Embodiment (Characteristics of Phosphor)

Figure 1:
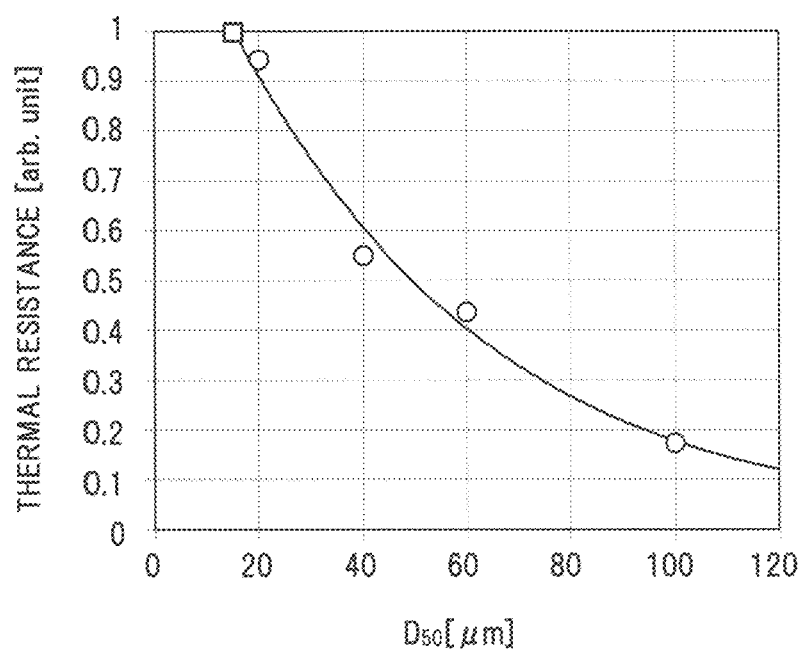
FIG. 1 is a graph showing a relation between particle diameter (D50) of YAG phosphor and thermal resistance.

The single crystal phosphor in the first embodiment is a YAG-based or LuAG-based single crystal phosphor of which base crystal is a $Y_3Al_5O_2$ (YAG)-based crystal or a $Lu_3Al_5O_{12}$ (LuAG)-based crystal and which has a composition represented by a compositional formula $(Y_{1-x-y-z}Lu_xGd_yCe_z)_{3+a}Al_{5-a}O_2$ ($0 \leq x \leq 0.9994$, $0 \leq y \leq 0.0669$, $0.001 \leq z \leq 0.004$, $-0.016 \leq a \leq 0.315$). Lu and Gd here are components which are substituted in the Y site but do not serve as emission centers. Ce is a component which can be substituted in the Y site and can serve as an emission center (an activator).

Meanwhile, of the above-mentioned composition of the single crystal phosphor, some atoms may be in different positions in the crystal structure. Also, although the composition ratio of O in the above compositional formula is 12, the above-mentioned composition also includes compositions with an O composition ratio slightly different from 12 due to presence of inevitably mixed oxygen or oxygen deficiency. Also, the value of "a" in the compositional formula is a value which inevitably varies in the production of the single crystal phosphor, but variation within the numerical range of about $-0.016 \leq a \leq 0.315$ has little effect on physical properties of the single crystal phosphor.

Also, the phosphor in the first embodiment is characterized in that Group II elements such as Ba or Sr and Group XVII elements such as F or Br are not contained and purity is high. These characteristics allow the phosphor to have higher brightness and longer life.

The reason why the numerical value of z representing the Ce concentration in the compositional formula is in a range of $0.0015 \leq z \leq 0.004$ is as follows: when the numerical value of z is less than 0.001, there is a problem that absorption by the particulate single crystal phosphor is reduced and external quantum efficiency is thus reduced, resulting in a decrease in emission intensity. On the other hand, when z is more than 0.004, high-temperature characteristics of the particulate single crystal phosphor degrade. For example, the internal quantum efficiency of phosphor at, e.g., 300° C. becomes less than 0.9. The Ce concentration of $0.001 \leq z \leq 0.004$ is an optimized range for the particulate single crystal phosphor and is different from a Ce concentration range suitable for, e.g., a plate-shaped single crystal phosphor.

Also, the phosphor in the first embodiment is a particulate single crystal phosphor having a particle diameter (D50) of not less than 20 μm. D50 here is a particle diameter at 50 vol % in the cumulative distribution.

When the particle diameter is increased, the surface area relative to volume is reduced and external quantum efficiency is thereby improved.

Also, in case that particulate phosphor is sealed with a transparent sealing member, the volume ratio of the phosphor to the material of the sealing member increases with increasing the particle diameter of the phosphor. Sealing material generally has a lower thermal conductivity than phosphor and thus causes thermal resistance to increase. Therefore, by increasing the volume ratio of the phosphor to the material of the sealing member, it is possible to reduce thermal resistance of the whole (the sealing member including the phosphor).

Meanwhile, known YAG polycrystalline phosphors are synthesized by solid-state reaction of oxide powder raw materials such as $Y_2O_3$, $Al_2O_3$ and $CeO_2$, and it is thus difficult to produce phosphor with a large particle diameter of not less than about 15 to 20 μm. On the other hand, the single crystalline YAG phosphor in the first embodiment is made by pulverizing a melt-grown ingot of single crystal phosphor, and thus can have even a particle diameter of not less than 100 μm.

In pulverizing the ingot, it is possible to use known pulverizing equipment such as roller mill, ball mill or jet mill. A mortar and pestle may be used when pulverizing a small amount. A material of the members coming into a contact with YAG, such as mills or balls, of the pulverizing equipment is preferably a material with high hardness, is most preferably a single crystalline YAG in view of contamination, but may be high-purity aluminum in view of productivity.

FIG. 1 is a graph showing a relation between particle diameter (D50) of YAG phosphor and thermal resistance. In the graph shown in FIG. 1, a point plotted at D50 of 15 μm is data from a known sintered YAG phosphor, and other points are data from a particulate single crystalline YAG phosphor in the first embodiment (obtained by pulverizing a region of a single crystal phosphor ingot in which composition distribution is in a range from $(Y_{0.9990}Ce_{0.0010})_{3.175}Al_{4.825}O_x$ to $(Y_{0.9985}Ce_{0.0015})_{3.167}Al_{4.833}O_x)$. The vertical axis in FIG. 1 is thermal resistance of 100 μm-thick films containing the respective fluorescent bodies sealed with a $SiO_2$-based inorganic sealing material and indicates a relative value when the thermal resistance value of the sealing film with the known sintered YAG phosphor is defined as 1. The thickness of the sealing film containing a phosphor with D50 of 100 μm is 110 μm.

As shown in FIG. 1, for example, thermal resistance can be reduced less than that of when containing the known YAG sintered phosphor by adjusting a particle diameter (D50) of the phosphor to 20 μm and can be reduced to half or less than half the thermal resistance of when containing the known YAG phosphor by adjusting to 60 μm. The present inventors also conducted experiments and confirmed that thermal resistance of a 100 μm-thick single crystalline YAG plate not containing a binder such as inorganic sealing material is about 0.1, and a particulate phosphor when having a particular size of about 100 to 120 μm can realize thermal resistance substantially equivalent to that of the single crystalline YAG plate.

Also, a decrease in fluorescence intensity associated with temperature increase is smaller in the YAG-based single crystal phosphor than in the YAG-based polycrystalline phosphor made by the sintering method, etc., as described previously. The small decrease in fluorescence intensity results from a small decrease in internal quantum efficiency. The same applies to the LuAG-based single crystal phosphor.

The phosphor in the first embodiment is more suitable for use under high-temperature conditions due to having excellent emission properties under high-temperature conditions which are inherent to the YAG-based or LuAG-based single crystal phosphor, as well as due to having an effect of reducing thermal resistance of a phosphor-including member by controlling the particle diameter. The phosphor can be very functional when used in, e.g., a light-emitting device having very high brightness per unit area, such as laser projector or laser headlight using laser light as excitation light. Also, since the phosphor in the first embodiment is in the form of particles, it is effective to increase light scattering and it is thereby possible to realize more uniform emission intensity and emission color.

Meanwhile, the known YAG-based or LuAG-based powder phosphor is polycrystalline powder made by the sintering method and has a particle diameter D50=10 to 15 μm. Since YAG-based or LuAG-based compounds have very high melting points, D50 of not less than 20 μm is very difficult to achieve by the sintering method, which is based on the solid-state reaction, due to temporal and qualitative limits.

Also, when the phosphor in the first embodiment is used for white lighting, etc., the particle diameter (D50) is preferably not more than 120 μm. This is because when more than 120 μm, yellow as a fluorescent color of the phosphor becomes too intense and it may be difficult to obtain white light with a desired chromaticity.

The particulate phosphor is obtained by pulverizing a single crystal phosphor ingot grown by a method in which a crystal is pulled upward from a source melt, such as CZ method (Czochralski method), EFG method (Edge-Defined Film-Fed Growth Method) or Bridgman method.

(Method for Producing the Phosphor)

Next, an example of a method for producing the phosphor in the first embodiment will be described in detail. A single crystal phosphor is grown by the CZ method in the following example.

Firstly, powders of $Y_2O_3$, $Lu_2O_3$, $Gd_2O_3$, $CeO_2$ and $Al_2O_3$ each having a high purity (not less than 99.99%) are prepared as starting materials and are dry-blended, thereby obtaining a mixture powder. Meanwhile, the raw material powders of Y, Lu, Gd, Ce and Al are not limited to those mentioned above. Also, when producing a single crystal phosphor not containing Lu or Gd, the raw material powders thereof are not used.

Figure 2:
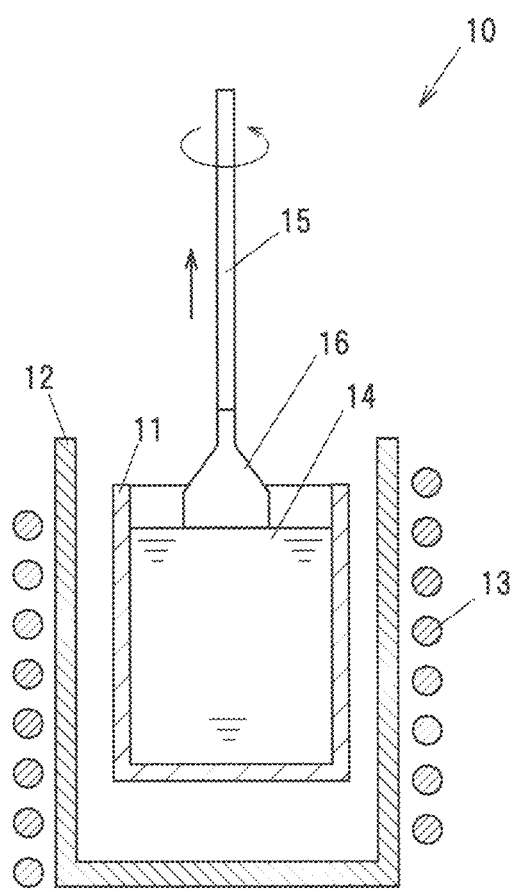
FIG. 2 is a schematic cross-sectional view showing how a single crystal phosphor ingot is pulled upward in the CZ method.

FIG. 2 is a schematic cross-sectional view showing how a single crystal phosphor ingot is pulled upward in the CZ method. A crystal growth system 10 is provided primarily with an iridium crucible 11, a ceramic cylindrical container 12 housing the crucible 11, and a high-frequency coil 13 wound around the cylindrical container 12.

The obtained mixture powder is loaded into the crucible 11, a high-frequency energy of 30 kW is supplied to the crucible 11 by the high-frequency coil 13 in a nitrogen atmosphere to generate an induced current, and the crucible 11 is thereby heated. The mixture powder is melted and a melt 14 is thereby obtained.

Next, a seed crystal 15 which is a YAG single crystal is prepared, the tip thereof is brought into contact with the melt 14, and the seed crystal 15 is pulled upward at a pulling rate of not more than 1 mm/h and rotated simultaneously at a rotation speed of 10 rpm at a pull-up temperature of not less than 1960° C., thereby growing a single crystal phosphor ingot 16 oriented to the <111> direction. The single crystal phosphor ingot 16 is grown in a nitrogen atmosphere at atmospheric pressure in a state that nitrogen is being supplied at a flow rate of 2 L/min into the cylindrical container.

The single crystal phosphor ingot 16 formed of a single crystal having a composition represented by the compositional formula $(Y_{1-x-y-z}Lu_xGd_yCe_z)_{3+a}Al_{5-a}O_{12}$ ($0 \leq x \leq 0.9994$, $0 \leq y \leq 0.0669$, $0.0002 \leq z \leq 0.0067$, $-0.016 \leq a \leq 0.315$) is thereby obtained. The size of the single crystal phosphor ingot 16 is, e.g., about 2.5 cm in diameter and about 5 cm in length.

In the YAG-based or LuAG-based single crystal phosphor, Ce has a significantly larger ionic radius than Y in the YAG-based or LuAG-based single crystal as a base crystal and is thus less likely to be incorporated into the crystal. Therefore, when the YAG-based or LuAG-based single crystal phosphor is grown by a pulling-up method such as CZ (Czochralski) method, the Ce concentration in the source melt increases as the crystal grows, hence, the YAG-based or LuAG-based single crystal phosphor has a Ce concentration distribution gradient such that the Ce concentration decreases toward the direction of pulling up the crystal. In other words, the Ce concentration in the YAG-based or LuAG-based single crystal phosphor increases from the seed (the seed crystal) toward the tail.

Figure 3:
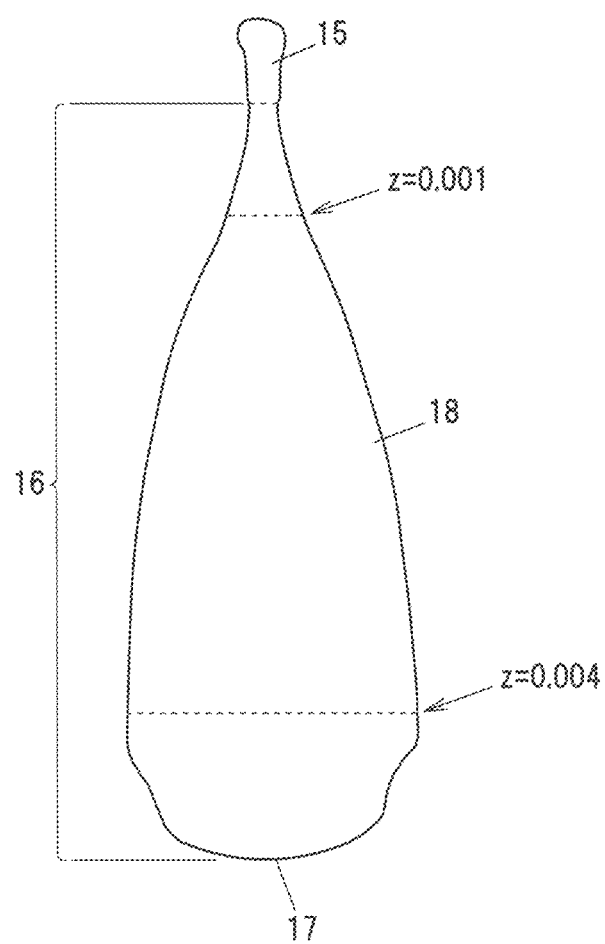
FIG. 3 is a schematic diagram illustrating a grown single crystal phosphor ingot.

FIG. 3 is a schematic diagram illustrating the grown single crystal phosphor ingot 16. In the single crystal phosphor ingot 16, the Ce concentration increases from the seed crystal 15 toward a tail 17.

In the first embodiment, a region of the single crystal phosphor ingot 16 in which z representing the Ce concentration in the compositional formula is, e.g., $0.001 \leq z \leq 0.004$ is cut out as a pulverizing region 18. In the pulverizing region 18, z representing the Ce concentration in the compositional formula is distributed continuously between 0.001 and 0.004 along the pull-up direction of the single crystal phosphor ingot 16. To be precise, this continuity of Ce concentration distribution is relevant to the effective segregation coefficient defined by FIG. 3 and Formula 1 (see below) described in "Journal of the Japanese Association for Crystal Growth, vol. 42, No. 2, 2015, p119-129". The Ce concentration is measured by the ICP-MS method, etc.

$$\frac{C_{crystal}}{C_{melt}} = k_{eff}(1-g)^{(k_{eff}-1)} \quad \text{(Formula 1)}$$

In the formula 1, "$C_{crystal}$" represents Ce concentration in crystal, "$C_{melt}$" represents initial Ce concentration in melt, "$k_{eff}$" represents effective segregation coefficient, and "g" represents solidification rate (weight of crystal/initial weight of melt).

Next, the pulverizing region 18 is pulverized and the particulate phosphor is obtained. Needless to say, this particulate phosphor has the same composition as the pulverizing region 18.

When z in the compositional formula of the pulverizing region 18 is, e.g., 0.001≤z≤0.004 and is continuously distributed in the range of not less than 0.001 and not more than 0.004, z in the compositional formula of each particle of the particulate phosphor obtained by pulverizing the pulverizing region 18 is 0.001≤z≤0.004, and z in the compositional formula of the particulate phosphor group is continuously distributed in the range of not less than 0.001 and not more than 0.004.

Emission color of phosphor changes depending on the Ce concentration. In detail, as the Ce concentration increases, the CIE chromaticity (x, y) shift from, e.g., yellow region to red region when the phosphor does not contain Lu in the Y site, and shift green region to yellow region when Lu is contained in the Y site.

Thus, when the Ce concentration of the compositional formula of the particulate single crystal phosphor group is continuously distributed in a predetermined range, the full width at half maximum of emission spectrum increases and color rendering properties are improved as compared to when the Ce concentration is constant.

Preferably, z in the compositional formula of each particle of the particulate phosphor is 0.001≤z≤0.004, and z in the compositional formula of the particulate phosphor group is continuously distributed in the range of not less than 0.001 and not more than 0.004. More preferably, z in the compositional formula of each particle of the particulate phosphor is 0.0015≤z≤0.0035, and z in the compositional formula of the particulate phosphor group is continuously distributed in the range of not less than 0.0015 and not more than 0.0035.

In general, Ce-containing powder phosphor made by the sintering method, etc., also has a certain level of Ce concentration distribution. However, this distribution is due to deviation from a desired Ce concentration and is normal distribution. On the other hand, the Ce concentration distribution in the particulate single crystal phosphor obtained by pulverizing a single crystal phosphor ingot in the first embodiment is not normal distribution.

Also, the pulverizing region 18 does not need to be the nearly entire region of the single crystal phosphor ingot 16. When z in the compositional formula of the single crystal phosphor ingot 16 is, e.g., 0.001 in a portion close to an end on the seed crystal 15 side and 0.004 in a portion close to an end on the tail 17 side, a region with z distributed in a range of not less than 0.003 and not more than 0.004 may be cut out as the pulverizing region 18 from the single crystal phosphor ingot 16. The particulate single crystal phosphor obtained from the pulverizing region 18 in this case has the CIE chromaticity (x, y) closer to red than the particulate single crystal phosphor obtained from the pulverizing region 18 with z distributed in a range of not less than 0.001 and not more than 0.004.

Then, the particulate single crystal phosphor obtained from the pulverizing region 18 with z distributed in a range of, e.g., not less than 0.001 and not more than 0.002 has the CIE chromaticity (x, y) closer to green than the particulate single crystal phosphor obtained from the pulverizing region 18 with z distributed in a range of not less than 0.001 and not more than 0.004.

Furthermore, the particulate single crystal phosphor obtained from the pulverizing region 18 with z distributed in a range of, e.g., not less than 0.002 and not more than 0.003 has the CIE chromaticity (x, y) between the particulate single crystal phosphor obtained from the pulverizing region 18 with z distributed in a range of not less than 0.003 and not more than 0.004 and the particulate single crystal phosphor obtained from the pulverizing region 18 with z distributed in a range of not less than 0.001 and not more than 0.002.

Also, if a difference between the maximum value and the minimum value of z in the compositional formula of the pulverizing region 18 is not less than 0.0005, it is effective to increase the full width at half maximum of fluorescence spectrum and it is also possible to increase the usable region of the single crystal phosphor ingot 16, allowing for reduction of the production cost of the phosphor.

Furthermore, absorption by the particulate single crystal phosphor obtained by pulverizing a single crystal phosphor ingot can be significantly improved by treating with hydrofluoric acid.

Figure 4:
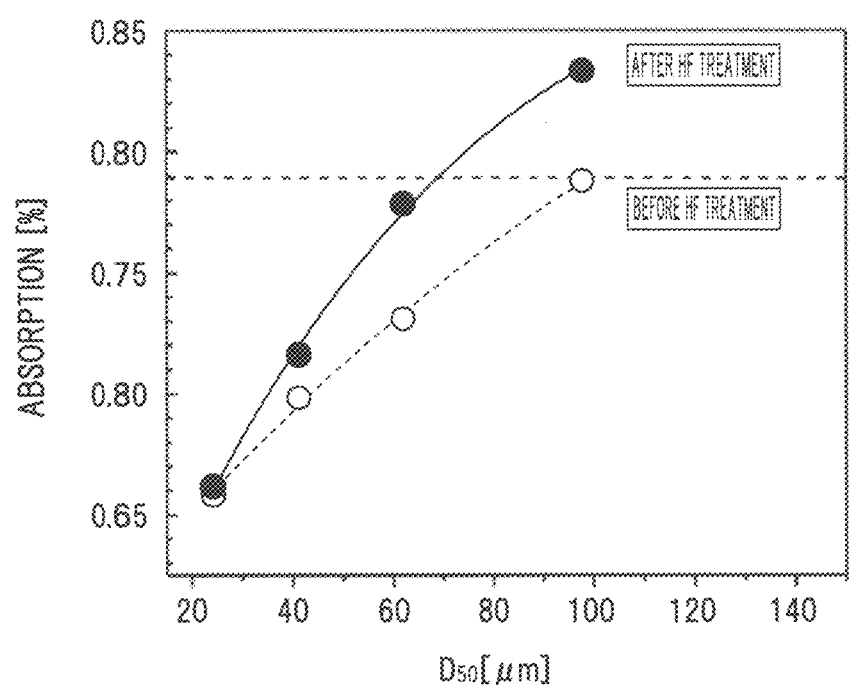
FIG. 4 is a graph showing changes in absorption before and after treating a particulate single crystal phosphor with hydrofluoric acid.

FIG. 4 is a graph showing changes in absorption before and after treating a particulate single crystal phosphor (obtained by pulverizing a region of a single crystal phosphor ingot in which composition distribution is in a range from $(Y_{0.6462}Lu_{0.3525}Ce_{0.0010})_{3.177}Al_{4.823}O_x$ to $(Y_{0.6870}Lu_{0.3109}Ce_{0.0021})_{3.130}Al_{4.870}O_x$) with hydrofluoric acid.

In detail, in the hydrofluoric acid treatment, a surface of the particulate single crystal phosphor is etched with 40% hydrofluoric acid at 40° C. for one hour.

FIG. 4 shows that absorption by the particulate single crystal phosphor is significantly improved by the hydrofluoric acid treatment. Based on the fact that external quantum efficiency largely related to emission intensity of phosphor is indicated by a value obtained by multiplying internal quantum efficiency by absorption, it can be said that emission intensity of the particulate single crystal phosphor is significantly improved by the hydrofluoric acid treatment.

Figure 5A:
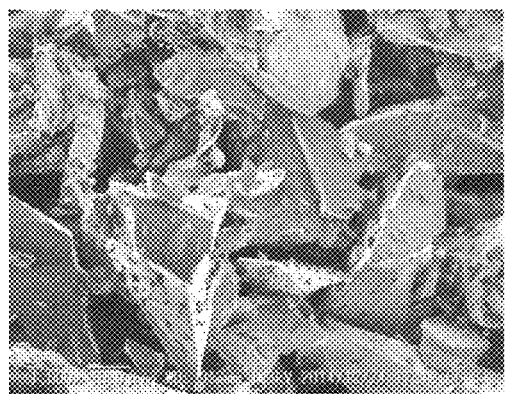
FIG. 5A is an SEM image showing the particulate single crystal phosphor before hydrofluoric acid treatment.
Figure 5B:
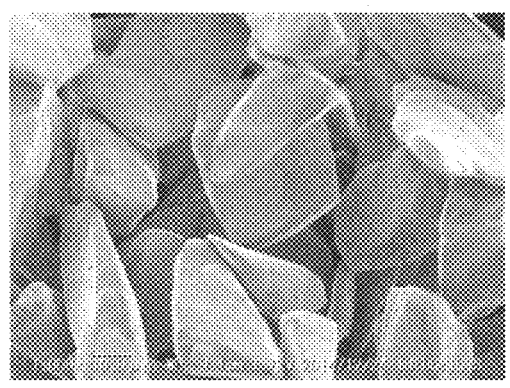
FIG. 5B is an SEM image showing the particulate single crystal phosphor after hydrofluoric acid treatment.

FIGS. 5A and 5B are SEM (Scanning Electron Microscope) images showing the particulate single crystal phosphor respectively before and after hydrofluoric acid treatment.

The single crystal phosphor after hydrofluoric acid treatment shown in FIG. 5B consists of particles each having rounded edges and has more curved surfaces than the single crystal phosphor before hydrofluoric acid treatment shown in FIG. 5A. It is considered that since the surfaces of the particles of the single crystal phosphor are curved as such, light reflection at the surface is reduced and absorption is improved. It is also considered that pulverizing has an effect of removing a crystal defect layer formed on the phosphor surface. Also, the rounded shape of the phosphor has such an effect that dispersibility when being dispersed in an inorganic sealing material is increased, the density of the phosphor in the film is improved, and thermal resistance is reduced.

Second Embodiment

The second embodiment of the invention is a light-emitting device using the single crystal phosphor in the first embodiment.

Figure 6:
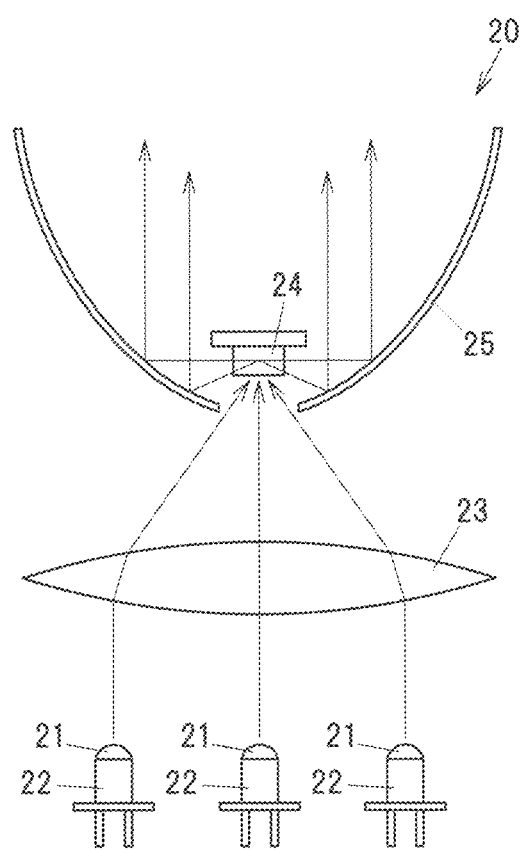
FIG. 6 is a schematic diagram illustrating a light source unit of a laser headlight as a light-emitting device in the second embodiment.

FIG. 6 is a schematic diagram illustrating a light source unit of a laser headlight 20 as a light-emitting device in the second embodiment. The laser headlight 20 has three laser diodes 22 each having a collimating lens 21, a condenser lens 23 for condensing blue laser light emitted from the laser diodes 22, a phosphor-including member 24 absorbing light condensed by the condenser lens 23 and emitting fluorescent light, and a mirror 25 reflecting the fluorescent light emitted from the phosphor-including member 24 and distributing light toward the front of the laser headlight 20. The laser headlight 20 is configured that white light is obtained by mixing blue light emitted from the laser diodes 22 and yellow light emitted from the phosphor-including member 24.

Figure 7A:
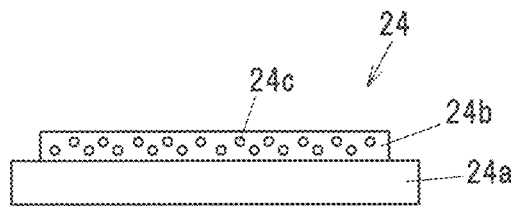
FIG. 7A is a cross sectional view showing a phosphor-including member in the second embodiment.
Figure 7B:
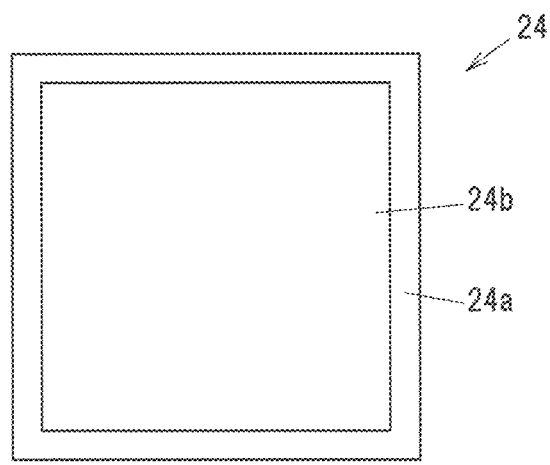
FIG. 7B is a plan view showing the phosphor-including member in the second embodiment.

FIGS. 7A and 7B are a cross sectional view and a plan view showing the phosphor-including member 24 in the second embodiment. The phosphor-including member 24 has a substrate 24a, a sealing material 24b formed on a surface of the substrate 24a, and a particulate phosphor 24c sealed in the sealing material 24b.

The substrate 24a is a substrate having a highly reflective surface, such as mirror substrate. Also, the substrate 24a is preferably connected to a highly thermally conductive radiator formed of Cu or Al, etc. The planar shape of the substrate 24a is not specifically limited.

Figure 7C:
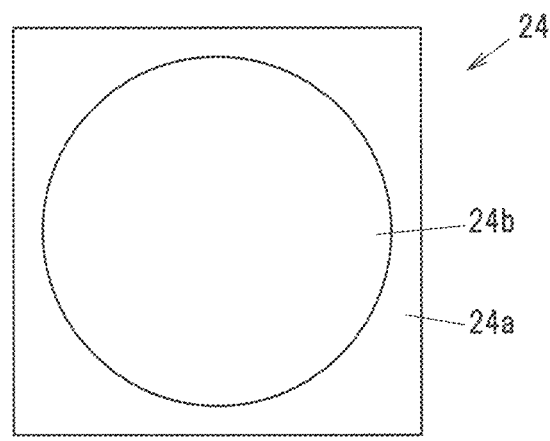
FIG. 7C is a plan view showing the phosphor-including member in the second embodiment.

The sealing material 24b is formed of a transparent inorganic material such as glass, $SiO_2$-based or $Al_2O_3$-based material, and thus has excellent heat resistance as compared to a sealing material formed of an organic material such as silicone. The planar shape of the sealing material 24b may be a square as shown in FIG. 7B, or may be a circle as shown in FIG. 7C.

The phosphor 24c is a phosphor formed of a particulate YAG-based or LuAG-based single crystal in the first embodiment, i.e., is a particulate phosphor which is formed of a single crystal having a composition represented by the compositional formula $(Y_{1-x-y-z}Lu_xGd_yCe_z)_{3+a}Al_{5-a}O_{12}$ ($0 \leq x \leq 0.9994$, $0 \leq y \leq 0.0669$, $0.001 \leq z \leq 0.004$, $-0.016 \leq a \leq 0.315$) and has a particle diameter (D50) of not less than 20 μm.

The phosphor 24c is also a particulate phosphor group of which z in the compositional formula is, e.g., $0.001 \leq z \leq 0.004$ and is continuously distributed between 0.001 and 0.004.

Thus, the phosphor 24c has excellent emission properties under high-temperature conditions and can stably and efficiently emit fluorescent light even when the high-power laser diodes 22 are used as sources of excitation light.

Third Embodiment

The third embodiment of the invention is a projector using the single crystal phosphor in the first embodiment.

Figure 8:
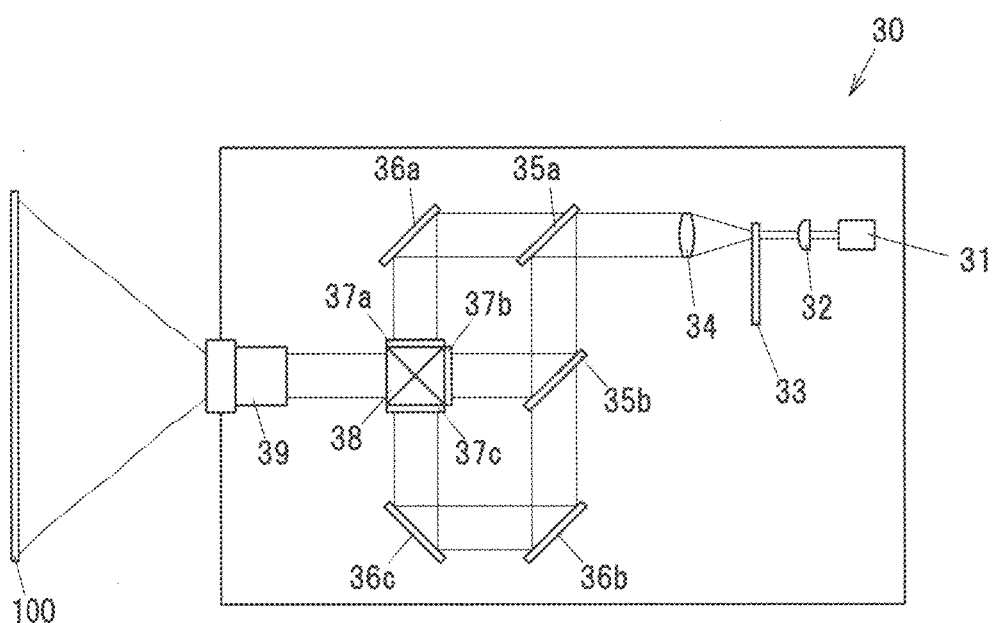
FIG. 8 is a schematic diagram illustrating a configuration of a projector in the third embodiment.

FIG. 8 is a schematic diagram illustrating a configuration of a projector 30 in the third embodiment. The projector 30 has a blue laser diode 31 as a light source, a phosphor-including member 33 which is excited by absorbing a portion of blue light emitted from the laser diode 31 and passing through a condenser lens 32 and emits yellow fluorescent light, a lens 34 for aligning the traveling direction of white light obtained by combining the yellow fluorescent light emitted from the phosphor-including member 33 and blue light transmitted without being absorbed by the phosphor-including member 33, a dichroic mirror 35a filtering white light passing through the lens 34 to allow for transmission of blue light and reflect the other light, a dichroic mirror 35b filtering the light reflected by the dichroic mirror 35a to allow for transmission of red light and reflect green light as the other light, a mirror 36a reflecting the blue light transmitted through the dichroic mirror 35a, mirrors 36b and 36c reflecting the red light transmitted through the dichroic mirror 35b, a liquid-crystal panel 37a driven and controlled to form a desired image and allowing the blue light reflected by the mirror 36a to be transmitted in a desired pattern, a liquid-crystal panel 37b driven and controlled to form a desired image and allowing the green light reflected by the dichroic mirror 35b to be transmitted in a desired pattern, a liquid-crystal panel 37c driven and controlled to form a desired image and allowing the red light reflected by the mirror 36c to be transmitted in a desired pattern, a prism 38 synthesizing the blue, green and red lights transmitted through the liquid-crystal panels 37a, 37b and 37c, and a lens 39 for spreading out the light synthesized by the prism 38 and emitting the light as an image onto an external screen 100.

The lens 34, the dichroic mirrors 35a, 35b, the mirrors 36a, 36b, 36c, the liquid-crystal panels 37a, 37b, 37c and the prism 38 constitute an image-forming section which forms an image by processing fluorescent light emitted from the phosphor-including member 33 and light emitted from the laser diode 31 in the projector 30. That is, the projector 30 is configured that an image formed by the image-forming section using fluorescent light emitted from the phosphor-including member 33 is projected onto the external screen 100.

Figure 9A:
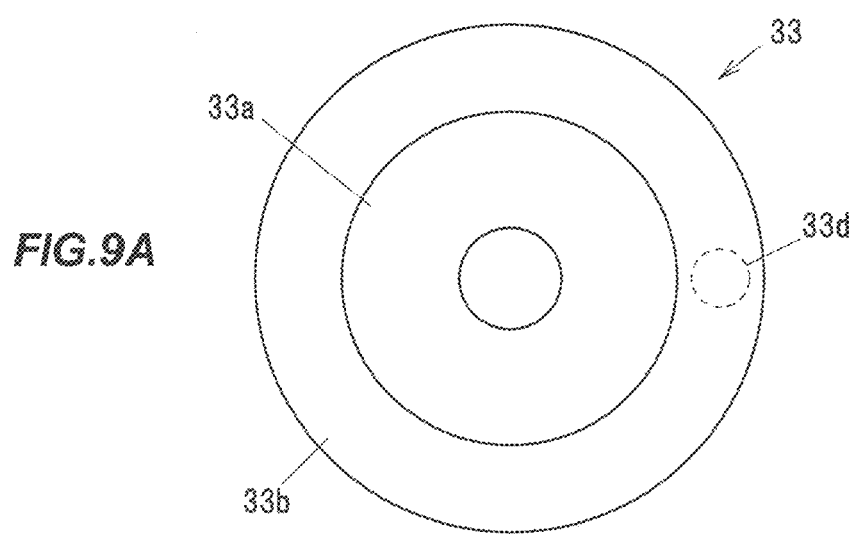
FIG. 9A is a plan view showing the phosphor-including member in the third embodiment.
Figure 9B:
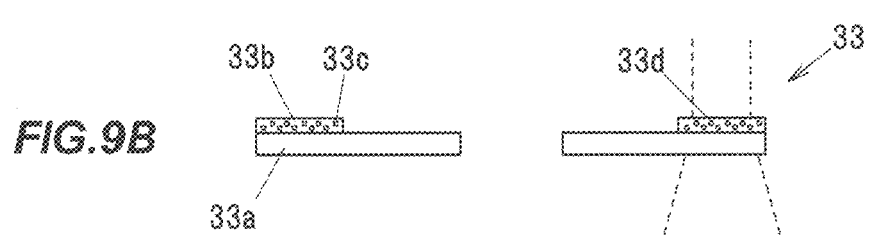
FIG. 9B is a cross sectional view showing the phosphor-including member in the third embodiment.

FIGS. 9A and 9B are plan views showing the phosphor-including member 33 in the third embodiment. The phosphor-including member 33 has a disc-shaped transparent substrate 33a, an annular sealing material 33b formed on a surface of the transparent substrate 33a along the outer periphery thereof, and a particulate phosphor 33c sealed in the sealing material 33b.

The transparent substrate 33a is formed of, e.g., sapphire having a high thermal conductivity and is placed inside the projector 30 so as to be rotatable in the circumferential direction.

The sealing material 33b is formed of a transparent inorganic material such as glass, $SiO_2$-based or $Al_2O_3$-based material, and thus has excellent heat resistance as compared to a sealing material formed of an organic material such as silicone.

The phosphor 33c is a phosphor formed of a particulate YAG-based or LuAG-based single crystal in the first embodiment, i.e., is a particulate phosphor which is formed of a single crystal having a composition represented by the compositional formula $(Y_{1-x-y-z}Lu_xGd_yCe_z)_{3+a}Al_aO_{12}$ ($0 \leq x \leq 0.9994$, $0 \leq y \leq 0.0669$, $0.001 \leq z \leq 0.004$, $-0.016 \leq a \leq 0.315$) and has a particle diameter (D50) of not less than 20 μm.

The phosphor 33c is also a particulate phosphor group of which z in the compositional formula is, e.g., $0.001 \leq z \leq 0.004$ and is continuously distributed between 0.001 and 0.004.

Thus, the phosphor 33c has excellent emission properties under high-temperature conditions and can stably and efficiently emit fluorescent light even when the high-power laser diode 31 is used as a source of excitation light.

Also, since the phosphor-including member 33 rotates when the projector 30 is in operation, an illuminated position 33d of the blue light emitted from the laser diode 31 changes constantly, allowing heat rise in the phosphor-including member 33 to be prevented. Therefore, operation under high-temperature conditions is further stabilized.

Also, since the phosphor 33c is excellent in emission properties at high temperature, a phosphor-including member of stationary type can be used in some cases in place of the rotary type as is the phosphor-including member 33. It is difficult to use the known polycrystalline phosphors in such a way since thermal quenching occurs unless having excellent emission properties at high temperature.

Also, such stationary phosphor-including member may be of transmissive type as is the phosphor-including member 33 using a transparent substrate, or may be of reflective type. The reflective phosphor-including member has, e.g., the same structure as the phosphor-including member 24 shown in FIG. 7. In this case, a highly-reflective metal substrate such as Ag or Al substrate is preferably used as the substrate 24a. Alternatively, a surface of a metal substrate may be coated with a highly-reflective Ag- or Al-based material, etc.

Meanwhile, in the projector 30, the light-emitting element used as a light source may be an LED in place of the laser diode 31. However, the effect by the phosphor-including member 33, i.e., excellent emission properties under high-temperature conditions, is exerted more significantly when using a high-power laser diode.

Also, although the projector 30 is a projector having a configuration in which a spectrum of yellow emission from phosphor is dispersed into green spectrum and red spectrum, the single crystal phosphor in the first embodiment can be used in a projector having a configuration in which green spectrum is directly extracted from a spectrum of green emission from phosphor. Also, the single crystal phosphor in the first embodiment can be used regardless of the configuration of the image-forming section of the projector.

Effects of the Embodiments

According to the embodiment, it is possible to obtain a particulate phosphor which is formed of a YAG-based or LuAG-based single crystal and has excellent external quantum efficiency and excellent emission properties under high-temperature conditions. Also, by using such particulate phosphor, it is possible to manufacture light-emitting device and projector which are excellent in operating performance and reliability.

Also, according to the embodiments, it is possible to provide a phosphor defined by [1] and [2] below, a phosphor-including member defined by [3] blow, a light-emitting device defined by [4] and [5] below, a projector defined by [6] and [7] below, and a method for producing a phosphor defined by [8] and [9] below.

[1] A phosphor, comprising a group of single crystal phosphor particles obtained by pulverizing a single crystal phosphor ingot grown by a pulling-up method, wherein each of the single crystal phosphor particles has a composition represented by a compositional formula $(Y_{1-x-y-z}Lu_xGd_yCe_z)_{3+a}Al_{5-a}O_{12}$ ($0 \leq x \leq 0.9994$, $0 \leq y \leq 0.0669$, $0.001 \leq z \leq 0.004$, $-0.016 \leq a \leq 0.315$), and z in the compositional formula is continuously distributed in the range of not less than 0.001 and not more than 0.004 in the group of single crystal phosphor particles.

[2] The phosphor defined by [1] above, wherein z in the compositional formula of each of the single crystal phosphor particles is $0.0015 \leq z \leq 0.0035$, and z in the compositional formula is continuously distributed in the range of not less than 0.0015 and not more than 0.0035 in the group of single crystal phosphor particles.

[3] A phosphor-including member, comprising: the phosphor defined by [1] or [2] above; and a sealing member comprising a transparent inorganic material sealing the phosphor or a binder comprising an inorganic material binding particles of the phosphor.

[4] A light-emitting device, comprising: a phosphor-including member that comprises the phosphor defined by [1] or [2] above and a sealing member comprising a transparent inorganic material sealing the phosphor or a binder comprising an inorganic material binding particles of the phosphor; and a light-emitting element that emits a blue light for exciting the phosphor.

[5] The light-emitting device defined by [4] above, wherein the light-emitting element comprises a laser diode.

[6] A projector, comprising: a phosphor-including member that comprises the phosphor defined by [1] or [2] above and a sealing member comprising a transparent inorganic material sealing the phosphor or a binder comprising an inorganic material binding particles of the phosphor; a light-emitting element that emits a blue light for exciting the phosphor; an image-forming section that forms an image by using a fluorescent light emitted from the phosphor-including member; and a lens for projecting the image formed by the image-forming section onto an external projection plane.

[7] The projector defined by [6] above, wherein the light-emitting element comprises a laser diode.

[8] A method for producing a phosphor, comprising: pulverizing a single crystal phosphor ingot grown by a pulling-up method to form a phosphor consisting of a group of single crystal phosphor particles each having a composition represented by the compositional formula $(Y_{1-x-y-z}Lu_xGd_yCe_z)_{3+a}Al_{5-a}O_{12}$ ($0 \leq x \leq 0.9994$, $0 \leq y \leq 0.0669$, $0.001 \leq z \leq 0.004$, $-0.016 \leq a \leq 0.315$), wherein z in the compositional formula is continuously distributed in the range of not less than 0.001 and not more than 0.004 in the group of single crystal phosphor particles.

[9] The method for producing a phosphor defined by [8] above, wherein z in the compositional formula of each of the single crystal phosphor particles is $0.0015 \leq z \leq 0.0035$, and z in the compositional formula is continuously distributed in the range of not less than 0.0015 and not more than 0.0035 in the group of single crystal phosphor particles.

Example 1

Ce concentration distribution in the single crystal phosphor ingot 16 of the first embodiment was examined in Example 1.

Table 1 below is data from the single crystal phosphor ingot 16 grown by the CZ method and containing Lu in the Y site and shows a relation among distance from an interface with the seed crystal 15 in a direction parallel to the growth direction, value of z representing the Ce concentration in the compositional formula, CIE chromaticity coordinate x, and CIE chromaticity coordinate y.

TABLE 1

| Distance from Interface with Seed crystal [mm] | Value of z | CIE chromaticity coordinate x | CIE chromaticity coordinate y |
|---|---|---|---|
| 14.4 | 0.0009 | 0.397 | 0.573 |
| 28.8 | Not measured | 0.402 | 0.572 |

TABLE 1-continued

| Distance from Interface with Seed crystal [mm] | Value of z | CIE chromaticity coordinate x | CIE chromaticity coordinate y |
|---|---|---|---|
| 46.8 | 0.0012 | 0.404 | 0.571 |
| 66.0 | Not measured | 0.410 | 0.568 |
| 91.2 | 0.0070 | 0.436 | 0.549 |

Table 1 shows that as the distance from the interface with the seed crystal 15 increases, the Ce concentration increases and the fluorescent color shifts from green to yellow.

Example 2

Temperature dependence of emission properties of the phosphor-including member shown in FIGS. 7A and 7B was examined in Example 2.

In the phosphor-including member in Example 2, an Al substrate was used as the substrate, a $SiO_x$-based inorganic sealing material was used as the sealing material, and the particulate single crystal phosphor in the first embodiment having a particle diameter (D50) of about 60 μm was used as the phosphor.

Figure 10:
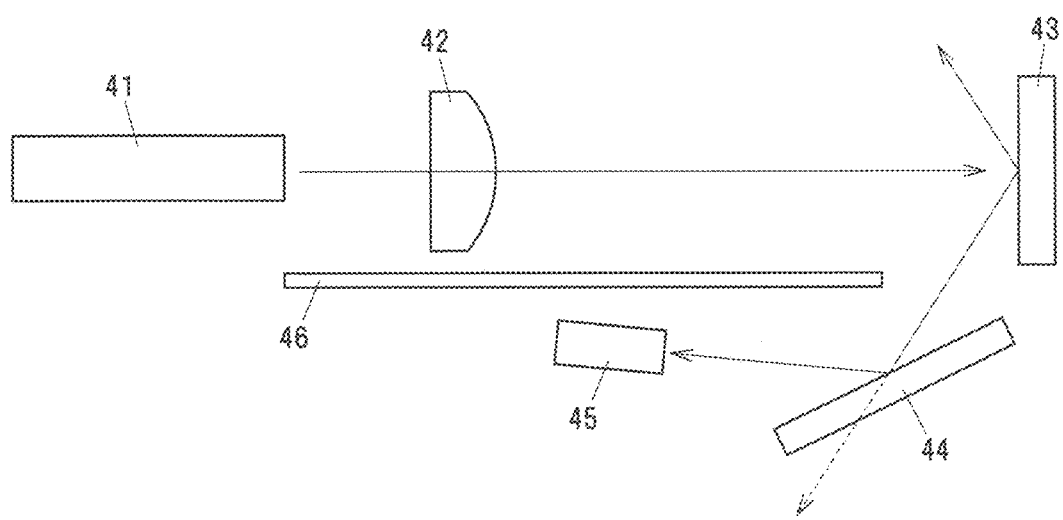
FIG. 10 is a schematic diagram illustrating a configuration of a test optical system in Example 2.

FIG. 10 is a schematic diagram illustrating a configuration of a test optical system in Example 2. The test optical system has a blue laser diode array 41 as a light source, a phosphor-including member 43 which is excited by absorbing a portion of blue light emitted from the laser diode array 41 and passing through a condenser lens 42 and emits yellow fluorescent light, a dichroic mirror 44 filtering white light obtained by combining the yellow fluorescent light emitted from the phosphor-including member 43 and blue light reflected without being absorbed by the phosphor-including member 43 to allow for transmission of blue light and reflect yellow fluorescent light, a photodiode 45 receiving yellow light and generating photocurrent, and a light shielding plate 46 allowing the photodiode 45 to receive only the light reflected by the dichroic mirror 44.

Figure 11A:
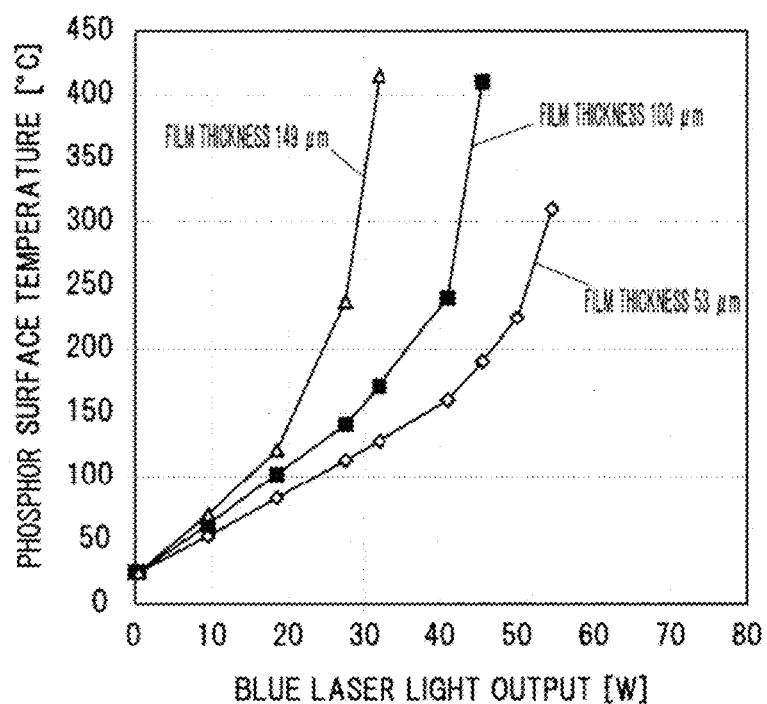
FIG. 11A is a graph showing a relation between output of laser diode array and surface temperature of phosphor sealed in three types of phosphor-including members having different sealing-member thicknesses when a known YAG-based polycrystalline phosphor is used as the phosphor contained in the phosphor-including members.

FIG. 11A is a graph showing a relation between output of the laser diode array 41 and surface temperature of phosphor sealed in three types of phosphor-including members 43 having different sealing-member thicknesses when the known YAG-based polycrystalline phosphor is used as the phosphor contained in the phosphor-including members 43.

Figure 11B:
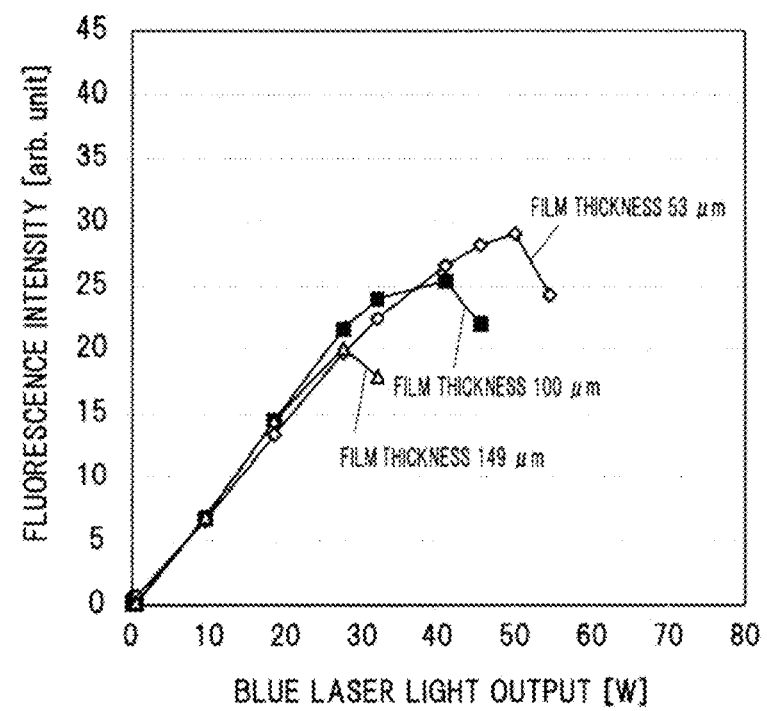
FIG. 11B is a graph showing a relation between output of laser diode array and fluorescence intensity of the three types of phosphor-including members having different sealing-member thicknesses when the known YAG-based polycrystalline phosphor is used as the phosphor contained in the phosphor-including members.

FIG. 11B is a graph showing a relation between output of the laser diode array 41 and fluorescence intensity of the three types of phosphor-including members 43 having different sealing-member thicknesses when the known YAG-based polycrystalline phosphor is used as the phosphor contained in the phosphor-including members 43.

The particle diameter (D50) of the known YAG-based polycrystalline phosphor pertaining to FIGS. 11A and 11B is 15 μm. Then, the thicknesses of the sealing materials of the three types of phosphor-including members 43 are 53 μm, 100 μm and 149 μm.

Figure 12A:
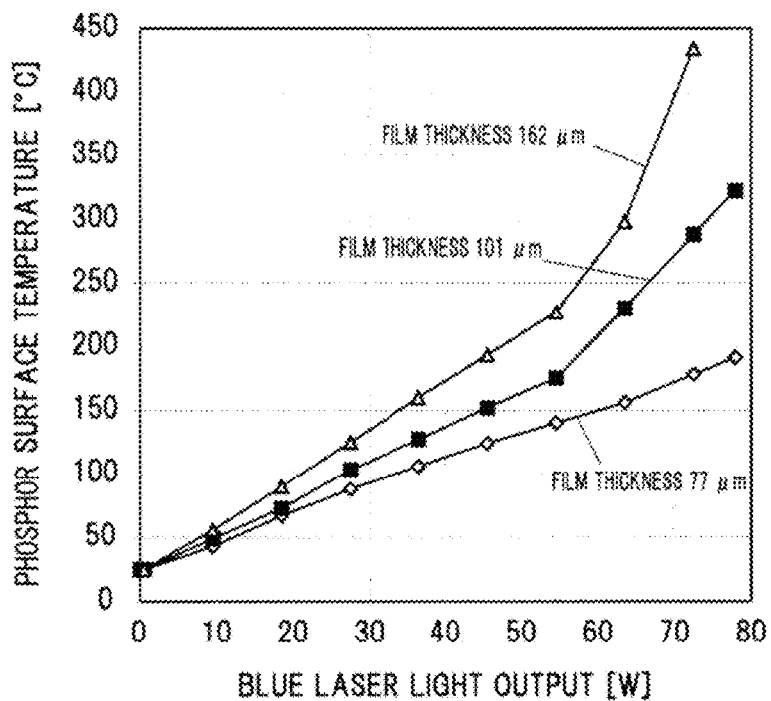
FIG. 12A is a graph showing a relation between output of laser diode array and surface temperature of phosphor sealed in three types of phosphor-including members having different sealing-member thicknesses when a YAG-based single crystal phosphor in the first embodiment is used as the phosphor contained in the phosphor-including members.

FIG. 12A is a graph showing a relation between output of the laser diode array 41 and surface temperature of phosphor sealed in three types of phosphor-including members 43 having different sealing-member thicknesses when a YAG-based single crystal phosphor in the first embodiment (obtained by pulverizing a region of a single crystal phosphor ingot in which composition distribution is in a range of $(Y_{0.6462}Lu_{0.3528}Ce_{0.0010})_{3.177}Al_{4.823}O_x$ from $(Y_{0.6870}Lu_{0.3109}Ce_{0.0021})_{3.130}Al_{4.870}O_x$) is used as the phosphor contained in the phosphor-including members 43.

Figure 12B:
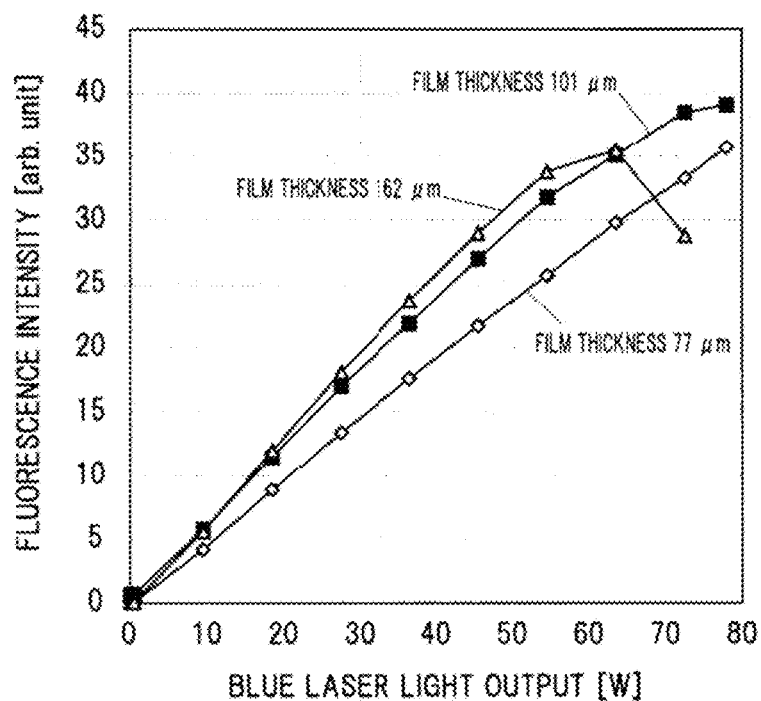
FIG. 12B is a graph showing a relation between output of laser diode array and fluorescence intensity of the three types of phosphor-including members having different sealing-member thicknesses when the YAG-based single crystal phosphor in the first embodiment is used as the phosphor contained in the phosphor-including members.

FIG. 12B is a graph showing a relation between output of the laser diode array 41 and fluorescence intensity of the three types of phosphor-including members 43 having different sealing-member thicknesses when the YAG-based single crystal phosphor in the first embodiment (obtained by pulverizing a region from a single crystal phosphor ingot in which composition distribution is in a range of $(Y_{0.6462}Lu_{0.3528}Ce_{0.0010})_{3.177}Al_{4.823}O_x$ to $(Y_{0.6870}Lu_{0.3109}Ce_{0.0021})_{3.130}Al_{4.870}O_x$) is used as the phosphor contained in the phosphor-including members 43.

The particle diameter (D50) of the YAG-based single crystal phosphor pertaining to FIGS. 12A and 12B is 20 μm. Then, the thicknesses of the sealing materials of the three types of phosphor-including members 43 are 77 μm, 101 μm and 162 μm.

When comparing FIG. 11A to FIG. 12A, it is clear that the slope of the increase in surface temperature of phosphor with respect to output of the laser diode array 41 is smaller (i.e., thermal resistance is smaller) in the YAG-based single crystal phosphor in the first embodiment than in the known YAG-based polycrystalline phosphor.

Also, while the slope of the temperature increase of the known YAG-based polycrystalline phosphor becomes sharper with decreasing internal quantum efficiency when the surface temperature exceeds about 100 to 150° C., the slope of the temperature increase of the YAG-based single crystal phosphor in the first embodiment is substantially constant up to about 200° C.

In consequence, the maximum value of fluorescence intensity of the known YAG-based polycrystalline phosphor was 29 when the thickness of the sealing material was 53 μm, but the maximum value of fluorescence intensity of the YAG-based single crystal phosphor in the first embodiment was 39 when the thickness of the sealing material was 101 μm, as shown in FIGS. 11B and 12B. Fluorescence intensity of the YAG-based single crystal phosphor in the first embodiment, when the thickness of the sealing material was 77 μm, was not saturated even when output of the laser diode array 41 was increase to 78W, and it is expected that higher fluorescence intensity can be obtained.

The invention is not intended to be limited to the embodiments and Examples, and the various kinds of modifications can be implemented without departing from the gist of the invention. For example, although a headlight has been described in the second embodiment as an example of the light-emitting device using the phosphor in the first embodiment and light-emitting elements, the light-emitting device is not limited thereto.

Also, a binder for binding particles of the phosphor may be used in place of the sealing material used to seal the particulate phosphor in the embodiments and Examples. The phosphor particles bound by the binder, when used in a reflective phosphor-including member in the embodiments and Examples, are arranged on a substrate having a highly reflective surface, such as mirror substrate. Also, the phosphor particles bound by the binder has enough strength to self-stand. Therefore, the particles bonded into a plate shape can be used alone as a transmissive phosphor-including member, but may be arranged on a highly thermally conductive transparent substrate such as sapphire substrate to dissipate heat. The binder is formed of an inorganic material such as $SiO_2$-based or $Al_2O_3$-based material.

Also, the invention according to claims is not to be limited to the embodiments and Examples described above. Further, it should be noted that all combinations of the features described in the embodiments and Examples are not necessary to solve the problem of the invention.

INDUSTRIAL APPLICABILITY

A particulate phosphor can be provided that includes a YAG-based or LuAG-based single crystal and that is excellent in external quantum efficiency and excellent in emission properties under high-temperature conditions, as well as a production method thereof, a phosphor-including member including the phosphor, and a light-emitting device or projector including the phosphor-including member.

REFERENCE SIGNS LIST

16 SINGLE CRYSTAL PHOSPHOR INGOT
18 PULVERIZING REGION
30 PROJECTOR
31 LASER DIODE
33 PHOSPHOR-INCLUDING MEMBER
33a TRANSPARENT SUBSTRATE
33b SEALING MATERIAL
33c PHOSPHOR

The invention claimed is:

1. A projector, comprising:
a phosphor-including member that comprises a particulate phosphor and a sealing member comprising a transparent inorganic material sealing the particulate phosphor or a binder comprising an inorganic material binding particles of the particulate phosphor;
a light-emitting element that emits a blue light for exciting the phosphor;
an image-forming section that forms an image by using a fluorescent light emitted from the phosphor-including member; and
a lens projecting the image formed by the image-forming section onto an external projection plane,
wherein the particulate phosphor comprises single crystal particles each having a composition represented by a compositional formula $$(Y_{1-x-y-z}Lu_xGd_yCe_z)_{3+a}Al_{5-a}O_{12} (0 \leq x \leq 0.9994, 0 \leq y \leq 0.0669, 0.001 \leq z \leq 0.004, -0.016 \leq a \leq 0.315),$$

and
wherein the particulate phosphor has a particle diameter (D50) of not less than 20 and not more than 120 μm.

2. The projector according to claim 1, wherein the light-emitting element comprises a laser diode.

* * * * *

UNITED STATES PATENT AND TRADEMARK OFFICE
CERTIFICATE OF CORRECTION

| | |
|---|---|
| PATENT NO. | : 11,525,082 B2 |
| APPLICATION NO. | : 16/074163 |
| DATED | : December 13, 2022 |
| INVENTOR(S) | : Daisuke Inomata |

It is certified that error appears in the above-identified patent and that said Letters Patent is hereby corrected as shown below:

In the Claims

Column 16, Claim 1, Line 20 should read:
(D50) of not less than 20 μm and not more than 120 μm.

Signed and Sealed this
Fourteenth Day of March, 2023

Katherine Kelly Vidal
*Director of the United States Patent and Trademark Office*